(12) United States Patent  (10) Patent No.: US 8,513,114 B2
Tagami  (45) Date of Patent: Aug. 20, 2013

(54) METHOD FOR FORMING A DUAL DAMASCENE INTERCONNECT STRUCTURE

(75) Inventor: Masayoshi Tagami, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/424,954

(22) Filed: Mar. 20, 2012

(65) Prior Publication Data

US 2012/0276735 A1   Nov. 1, 2012

Related U.S. Application Data

(60) Provisional application No. 61/480,833, filed on Apr. 29, 2011.

(51) Int. Cl.
*H01L 21/4763* (2006.01)
(52) U.S. Cl.
USPC ........... 438/637; 438/671; 438/717; 257/758; 257/E21.579

(58) Field of Classification Search
USPC ......... 438/637, 623, 671, 717; 257/E21.575, 257/E21.577, E21.579, 758
See application file for complete search history.

(56) References Cited

U.S. PATENT DOCUMENTS

| | | | | |
|---|---|---|---|---|
| 6,969,685 | B1 * | 11/2005 | Li et al. | 438/710 |
| 7,358,182 | B2 * | 4/2008 | Baks et al. | 438/637 |
| 8,298,935 | B2 * | 10/2012 | Chen et al. | 438/636 |
| 2012/0187546 | A1 * | 7/2012 | Akinmade-Yusuff et al. | 257/622 |

* cited by examiner

*Primary Examiner* — William F Kraig
*Assistant Examiner* — Gardner W Swan
(74) *Attorney, Agent, or Firm* — Young & Thompson

(57) ABSTRACT

An improved method of forming a semiconductor device including an interconnect layer formed using multilayer hard mask comprising metal mask and dielectric mask is provided. To form the second opening pattern being aligned to the first pattern, after the multilayer hard mask is used at the first step, then the dielectric mask is used to form a damascene structure in an insulator layer at the second step followed by removing the metal mask.

16 Claims, 12 Drawing Sheets

METHOD FOR FORMING A DUAL DAMASCENE INTERCONNECT STRUCTURE

TECHNICAL FIELD OF THE INVENTION

The invention relates to methods of making integrated circuits. More specifically it relates to methods of fabricating interconnect structures in semiconductor devices.

BACKGROUND OF THE INVENTION

The need for lower resistance and capacitance in interconnect dielectric films caused by the ever-increasing miniaturization of semiconductor devices has led to the use of copper to form interconnects and vias rather than aluminum. When those structures are formed from copper a dual damascene process is typically used, in view of the difficulty in dry etching copper.

As the line width of interconnects continues to decrease, additional measures must be taken to guarantee the reliability of damascene interconnects that include trenches and vias. Brain et. Al., "Low-k Interconnect Stack with a Novel Self-Aligned Via Patterning Process for 32 nm High Volume Manufacturing," IITC2009, session 13.1 (pp. 249-251), discloses a hardmask process for making the tightest pitch layers in the interconnect stack, to enable production of Self-Aligned Vias (SAV). In this and other conventional dual damascene processes, the vias are first created in the ILD, followed by the trenches, and then the vias and trenches are lined with a metallic Cu barrier and then filled with bulk Cu, followed by planarization.

U.S. Pat. No. 7,067,919 discloses a damascene interconnect method in which a metal mask having a trench pattern is formed on an oxide film overlying an interconnect film. The via pattern is defined in a layer of photo resist overlying the metal mask, and the interconnect film is etched to form the vias. After via formation, the photo resist film is removed and the trenches are formed using the metal mask, followed by filling the trenches and vias with copper.

U.S. Pat. No. 7,524,752 discloses removing a metal mask after forming trenches and vias, filling the trenches and vias with metal, followed by chemical mechanical processing (CMP). Dimensional variation that could occur if the metal mask were removed by CMP after filling the trenches and vias is said to be reduced.

The present inventor has however found that these techniques have various problems. Low-k film is typically used for the interconnect dielectric layers, so as to reduce unwanted interlayer capacitance. On the other hand, a metal mask is used to form an opening such as a via or through hole or trench, in order for the feature to be self-aligned. However, when using metal mask to form fine patterns, there is a difference in the stresses between the low-k film and the metal mask, which causes strain at the interfaces between these layers, and which makes it difficult to obtain a desired pattern with a high degree of precision.

SUMMARY

The present invention provides novel methods for making semiconductor devices, in which a first pattern is formed in both a metal film and an underlying dielectric layer that overlie an insulator layer above a semiconductor substrate. A second pattern is formed in the insulator layer, the second pattern being defined at least in part by a first mask positioned above the metal film and the dielectric layer. The metal film is then removed, and the first pattern is transferred to the insulator layer using the dielectric layer as a second mask. The first pattern preferably extends into the insulator layer to a depth different than that of the second pattern in the insulator layer.

In preferred embodiments, the second pattern is defined by the overlapping profiles of the mask and the first pattern in the metal film. The first mask may comprise a patterned layer of photoresist.

The first pattern preferably comprises a series of elongated openings arranged generally parallel to one another, corresponding to trenches to be formed in the insulator layer. The second pattern preferably comprises an array of openings corresponding to vias to be formed through the insulator layer. In such embodiments the first pattern is transferred to the insulator layer as a series of trenches whose depth is less than the thickness of the insulator layer, and the second pattern is formed in the insulator layer as an array of vias that preferably pass entirely through the insulator layer.

The trenches and vias formed according to these embodiments of the invention are preferably then filled with copper by a damascene method.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1A:
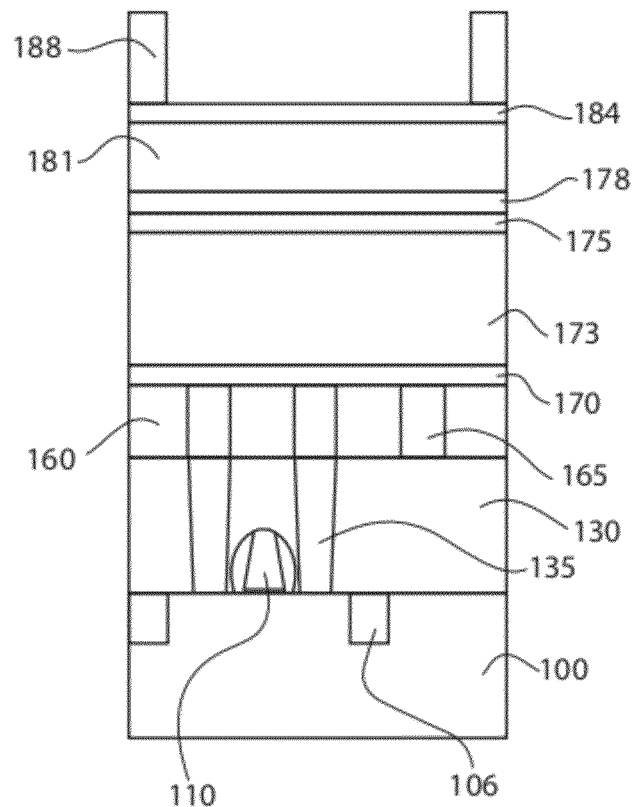
FIGS. 1A and 1B are cross-sectional and top views respectively, through a semiconductor device at a first stage of processing according to a preferred embodiment of the method according to the present invention.

In FIG. 1a, an insulator layer 173 has been formed on a substrate 100, and dielectric layer 175 is formed on the insulator layer 173. Metal film 178 is formed on the dielectric layer 175, and overlying metal film 178 is a photoresist tri-mask composed of photoresist layer 188, SiARC layer 184 (Si-based Anti-Reflection Coating layer) or LTO (Low Temperature Silicon Oxide) and an organic layer 181, which is preferably an organic planarization layer (OPL), which acts like an unexposed resist.

Figure 1B:
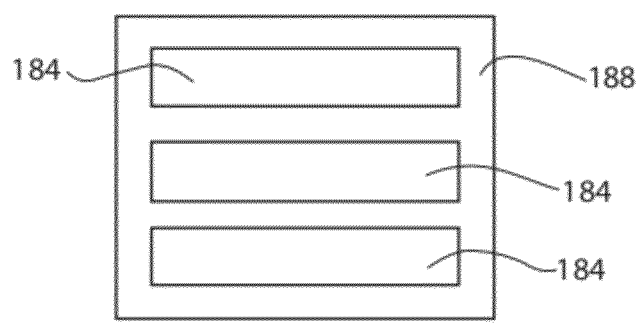

As can be seen in FIG. 1b, photoresist layer 188 bears a trench pattern, with the openings in the pattern exposing the underlying SiARC layer 184.

The semiconductor device beneath the interconnect layers described above is in this example a transistor 110, which includes device isolation regions 106, insulator layer 130 and contact holes 135 formed on a substrate 100, such as silicon substrate. Another interconnect layer 160 including interconnect 165 may overlie the insulator layer 130. Etch stop film 170, for example a silicon and nitrogen-containing film, is formed on the interconnect layer 160.

The insulator layer 173 is formed on the etch stop film 170. Dielectric layer 175 and metal film 178 are formed in that order as a hard mask layer on the insulator layer 173.

The insulator layer 173 may include a porous SiOCH material. $SiO_2$ is preferably used as the dielectric layer 175, although SiC, SiN or SiCN may also be used to form the dielectric layer 175. Metal film 178 may include TiN, TaN or WN. As it is desirable to remove this dielectric layer 175 selectively from the insulator layer 173 when forming a mask, the carbon content in the insulator layer 173 may be more than 40 atomic percent, as shown in the FIG. 13.

Figure 2A:
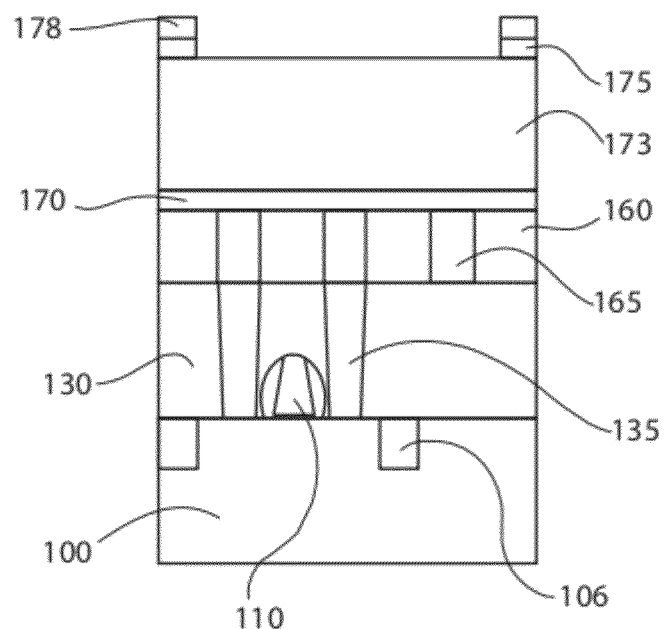
FIGS. 2A and 2B are cross-sectional and top views respectively, through the semiconductor device of FIGS. 1A and 1B at a subsequent stage of processing.
Figure 2B:
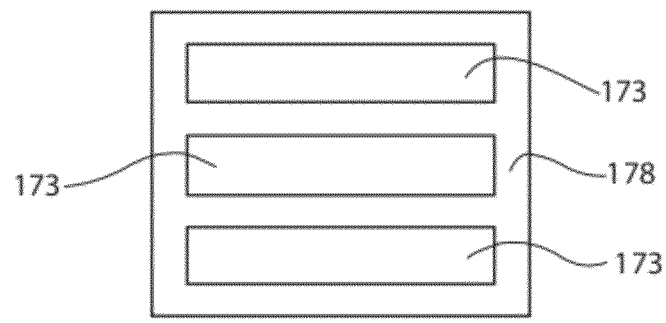

Turning now to FIGS. 2A and 2B, Si-ARC layer 184, OPL layer 181, metal film 178 and dielectric layer 175 are dry-etched so as to expose the insulator layer 173, through photo resist mask 188. After removal of the residual tri-mask layers e.g. by ashing, the metal film 178 and underlying dielectric layer 175 now bear the pattern transferred from mask 188, exposing the underlying insulator layer 173 through the trench openings (see FIG. 2B).

When the metal film 178 includes TiN, TaN or WN, carbon fluoride-based gases, such as $CF_4/C_4F_8/Ar/N_2/CO$, are preferably utilized to etch the metal film 178. According to the present embodiment, the dry-etching selectivity between the insulator layer 173 and the dielectric layer 175 can be controlled to be in a range from 5-20 by choosing the materials and the etching condition.

When the dielectric layer 175 is made of $SiO_2$, the main etching gas for etching the dielectric layer will be selected from $O_2$, $N_2$, $H_2$, $N_2/H_2$, $NH_3$, CO and $CO_2$. To avoid residual SiO, at least one additional gas selected from $CHF_3$, $CH_2F_2$, $C_4F_8$, $CHF_3$, $CF_3I$, $CF_4$ and $NF_3$ is preferably added to the main etching gas. The ratio of additional gas to main gas may be 0-20 volume %, preferably 5-10 volume %. To obtain a high selectivity, $O_2/CH_2F_2$ is preferably used for this etching step. To reduce the damage to the insulator layer 173, $N_2/CH_2F_2$, $N_2/H_2/CH_2F_2$ or $CO_2/CO/CH_2F_2$ is preferably used for this etching step.

When the dielectric layer 175 is made of SiC, SiN or SiCN, the same gases as for $SiO_2$ may be used. It is also possible to use etching gas selected from $O_2/C_4F_8$, $N_2/C_4F_8$, $N_2/H_2/C_4F_8$ and $CO_2/CO/C_4F_8$. $C_4F_8$ as additional gas may be added in a quantity of 0-20 volume %. Ar may be added to generate plasma.

The etching chamber pressure is preferably set to about 6.7 Pa (50 mT) and the bias power is preferably set on source power of about 500 W and bias power of about 100 W, for example.

Figure 3A:
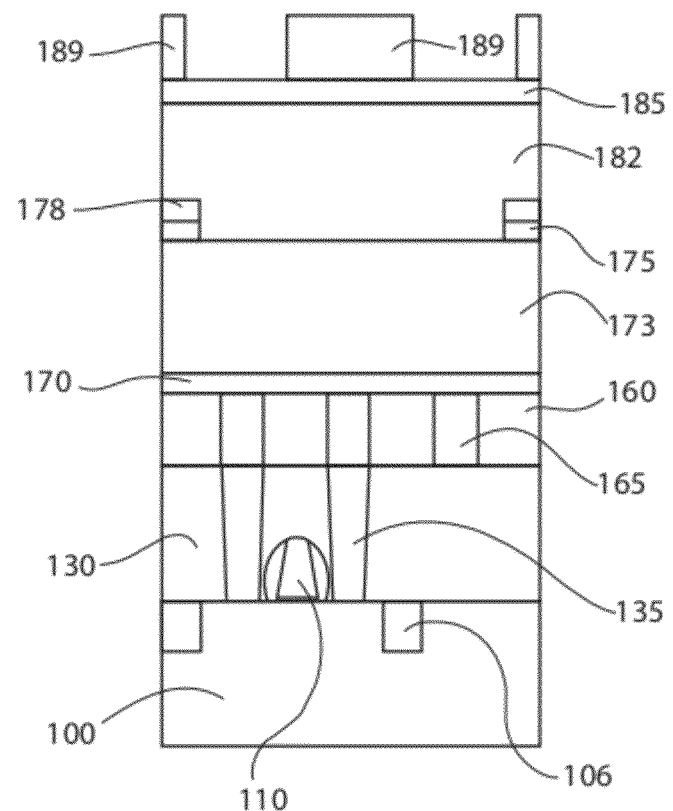
FIGS. 3A and 3B are cross-sectional and top views respectively, through the semiconductor device of FIGS. 2A and 2B at a subsequent stage of processing.
Figure 3B:
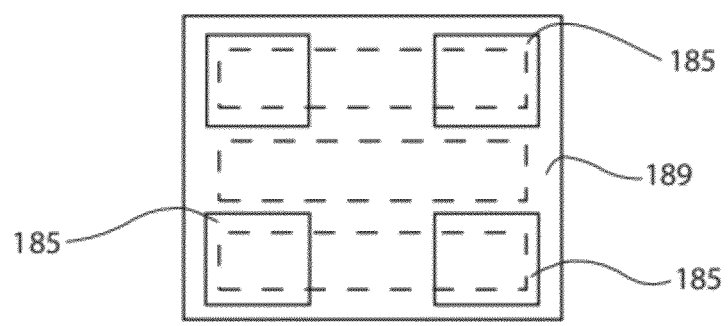

Next, as shown in FIGS. 3A and 3B, the via lithography is performed. A tri-layer via mask is composed of new OPL layer 182 formed on the metal film/mask 178, new SiARC layer 185 and new resist film 189. As shown in FIG. 3B, resist film 189 has openings defining a via pattern, exposing the underlying SiARC layer 185. The broken lines in FIG. 3B show the location of the underlying trench openings in the metal mask 178 and dielectric layer 175, from which it can be seen that the vias to be formed in the insulator layer 173 will be defined in part by photo resist mask 189 and in part by the trench hardmask 178/175, which promotes self-alignment of the vias to the trenches.

Figure 4A:
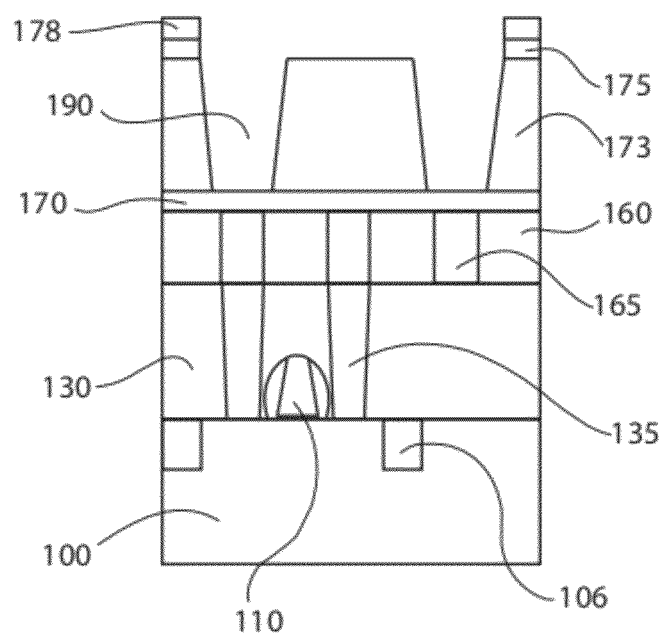
FIGS. 4A and 4B are cross-sectional and top views respectively, through the semiconductor device of FIGS. 3A and 3B at a subsequent stage of processing.
Figure 4B:
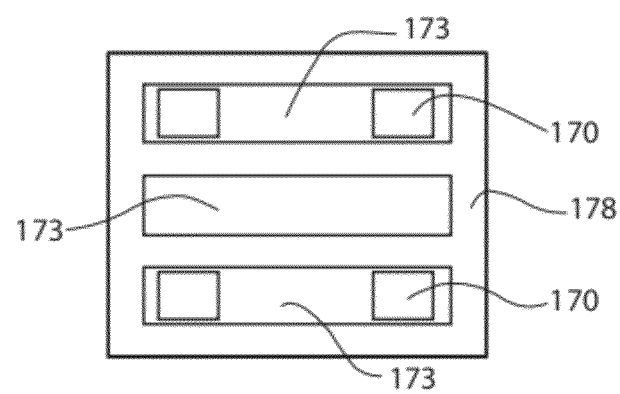

The via tri-mask is then dry etched as described above in connection with the trench lithography. In this step, however, etching is continued to actually form the vias 190 extending through dielectric layer 173 and reaching etch stop layer 170, as shown in FIG. 4A. After removal of the residual photo resist 189, SiARC layer 185 and the OPL layer 182 by ashing, the plan view of FIG. 4B is again of metal film 178, but now through its openings there can be seen the partially etched insulator layer 173 as well as the regions of etch stop layer 170 that are exposed at the bottom of the vias 190.

Figure 5A:
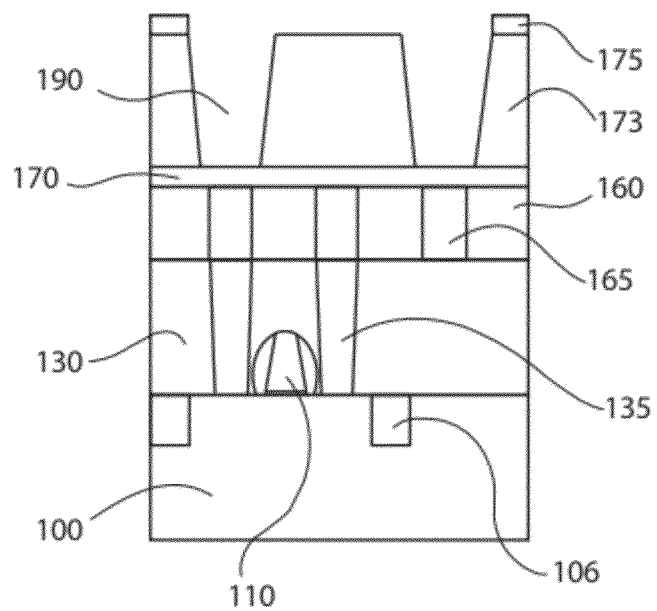
FIGS. 5A and 5B are cross-sectional and top views respectively, through the semiconductor device of FIGS. 4A and 4B at a subsequent stage of processing.
Figure 5B:
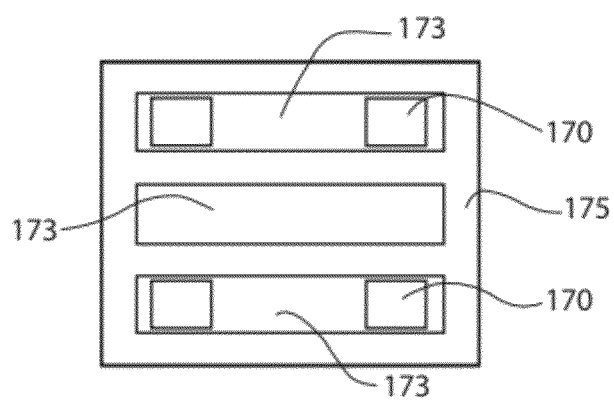

At this stage of the process according to the present embodiment, the metal layer 178 is removed from the dielectric layer 175 by dry etching or wet etching, as shown in FIGS. 5A and 5B. The trench pattern that had been transferred to metal layer 178 is preserved in the dielectric layer 175, as shown in FIG. 5B, but the trenches themselves are not yet formed in the insulator layer 173.

$Cl_2$ may be used as an etching gas to remove the metal film 178 from the dielectric layer 175, because it has good selectivity for the metal film when TiN is used for the metal film 178. Alternatively or in addition, $H_2O_2$ or a mixed solution of $H_2O_2$ and an alkaline additive may be used as a wet etching solution when TiN is used for the metal film 178.

Figure 6A:
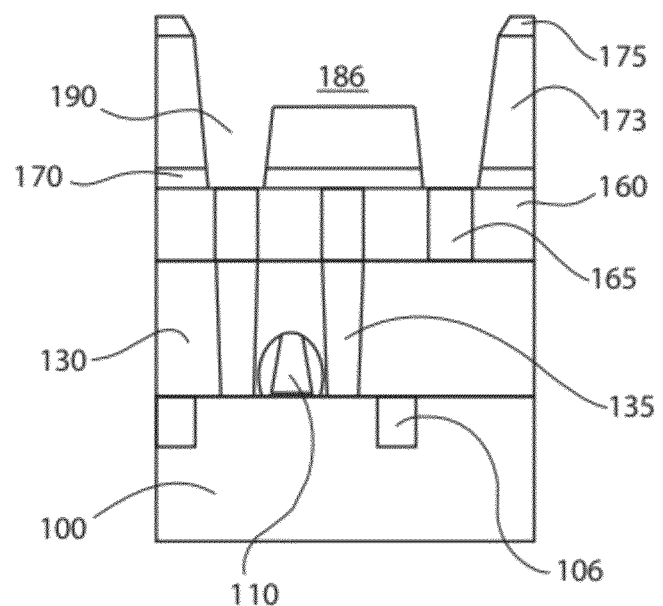
FIGS. 6A and 6B are cross-sectional and top views respectively, through the semiconductor device of FIGS. 5A and 5B at a subsequent stage of processing.
Figure 6B:
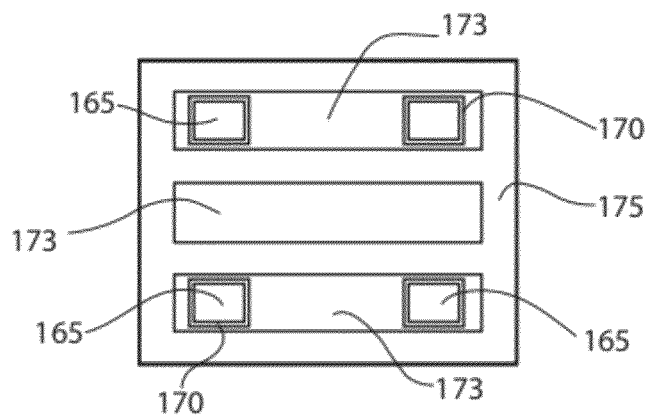

Referring to FIGS. 6A and 6B, trenches 186 are then formed in the insulator layer 173, using dielectric layer 175 as a mask. This etching serves also to remove the etch stop film 170 exposed at the bottoms of the vias 190, to reveal the underlying interconnects 165. Trenches 186 and vias 190 are thus aligned, as shown in FIG. 6B.

When the metal film 178 is etched by dry-etching, it is possible to perform the above-described process in the same dry-etching chamber, from the step of patterning the photoresist 188 through formation of the trenches in the insulator layer 173. However, it is also possible to use equipment having multiple chambers through which the device is transported between the steps of patterning photoresist 188 and forming the trench pattern in insulator layer 173.

Figure 7A:
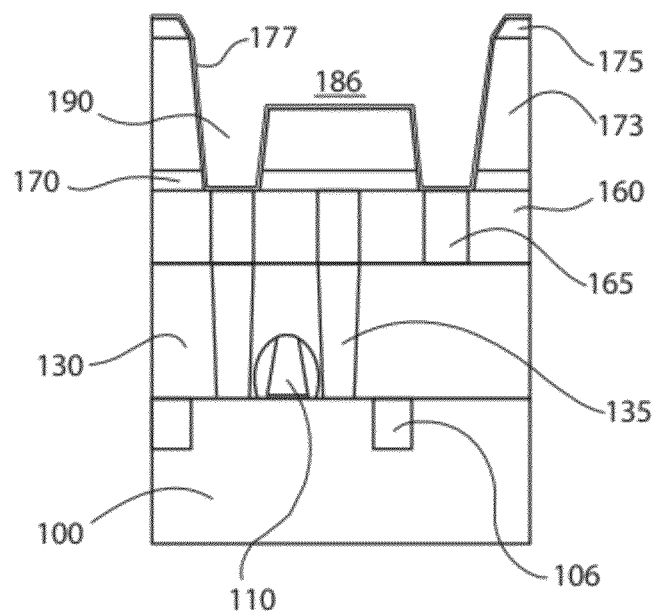
FIG. 7A is a cross sectional view, through the semiconductor device of FIG. 6A at a subsequent stage of processing.
Figure 7B:
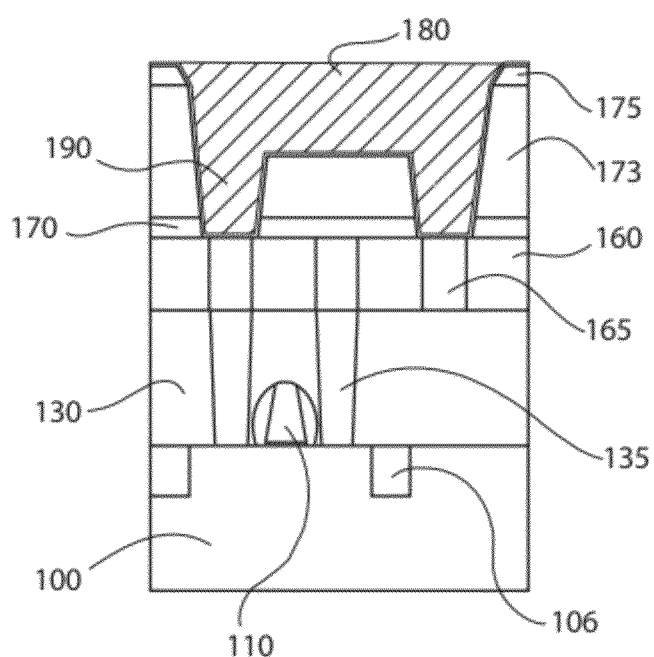
FIG. 7B is a cross sectional view, through the semiconductor device of FIG. 7A at a subsequent stage of processing.

After forming trenches 186 in the insulator layer 173, a wet clean process may be performed using conventional cleaning solutions such as dilute hydrofluoric acid or an organic amine solution. Next, as shown in FIG. 7A, a barrier film 177 such as TaN is formed on the insulator layer 173. Then, a layer 180 of a metal, preferably Cu, is formed by plating following seed metal PVD, for example, and excess metal film is removed by CMP, as shown in FIG. 7B.

Figure 8:
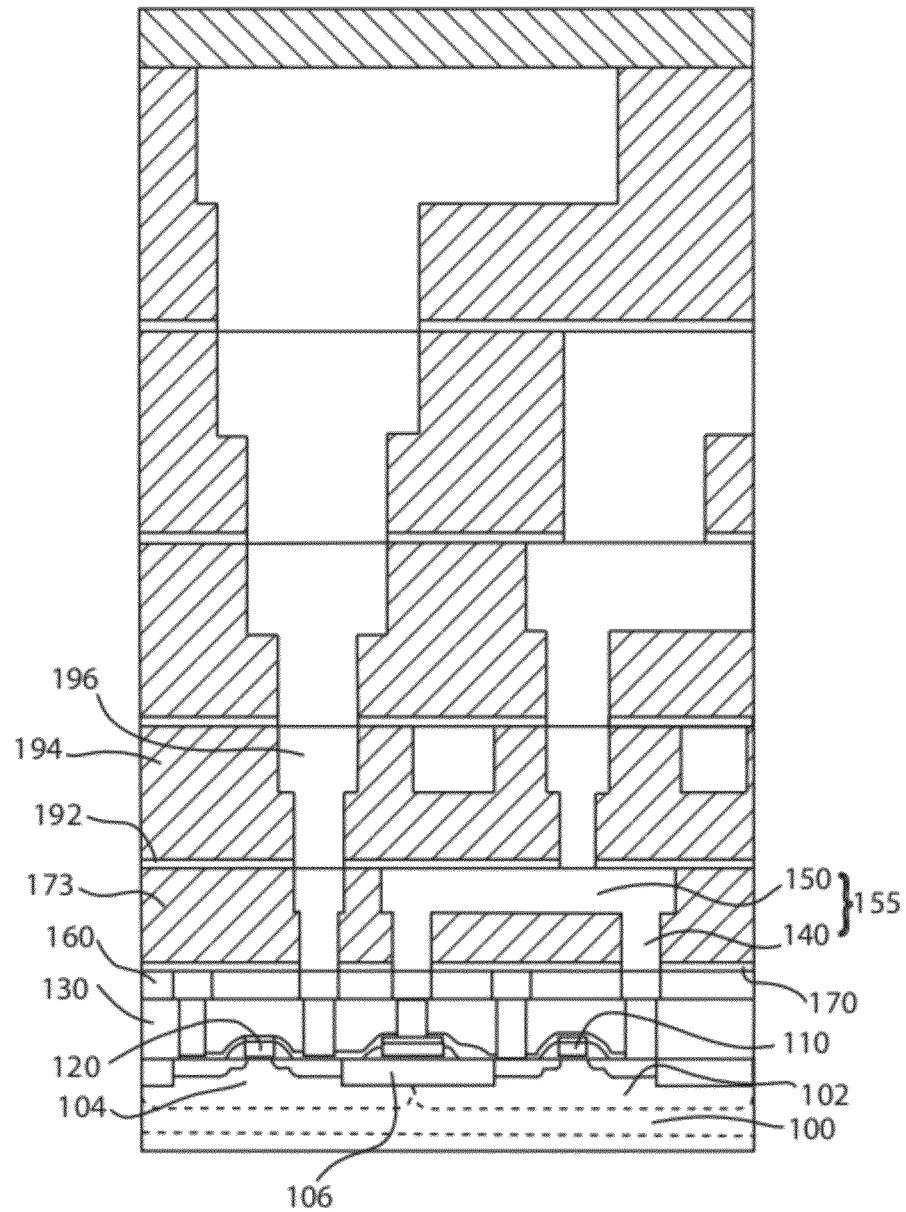
FIG. 8 is an overall schematic cross sectional view of a semiconductor device according to an embodiment of the present invention.
Figure 9A:
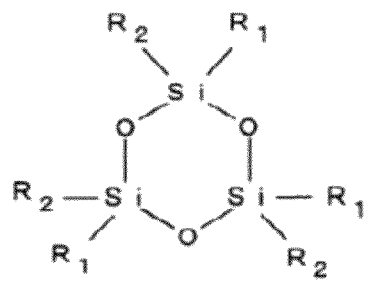
FIGS. 9A through 9D show the chemical formulae of exemplary materials that may be utilized in preferred embodiments of the present invention.
Figure 9B:
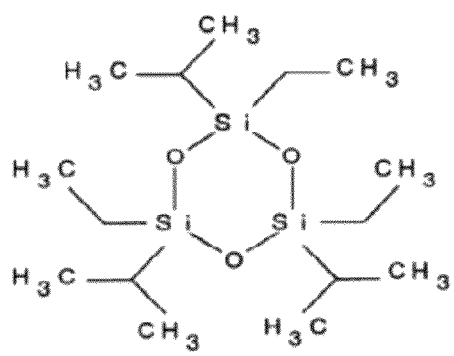
Figure 9C:
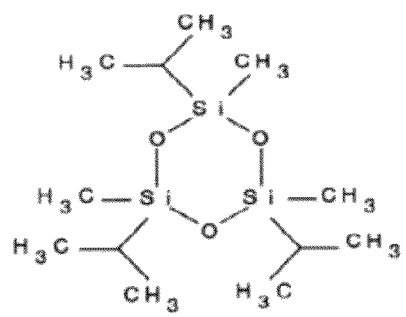
Figure 9D:
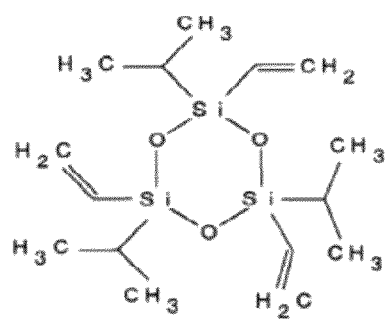

FIG. 8 schematically depicts an overall semiconductor device as may be formed by the methods according to the present invention. A variety of interconnects 155 are depicted, each composed of at least one via 140 and at least one trench 150 formed in an insulator layer 173. A next interconnect layer comprises etch stop layer 192 and insulator layer 194 formed on the insulator layer 173 (after forming the interconnects 155). Interconnect 196 is formed in the insulator layer 194 in the same way as the interconnect 155. A semiconductor device having the multilayer interconnects illustrated in the FIG. 8 is formed by repeatedly forming interconnects as described above.

Figure 10:
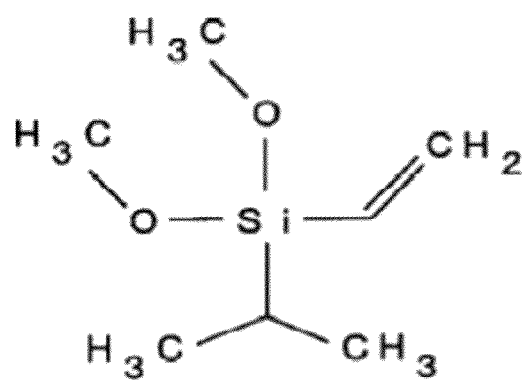
FIG. 10 show the chemical formula of a further exemplary material that may be utilized in preferred embodiments of the present invention.

FIGS. 9A-9D illustrate examples of compounds that form porous materials that are well-suited for use as the insulator layers 173, 194, etc. These compounds are ring shaped organo-siloxanes. It is also possible to use MPS (Molecular Pore Silica), which is a material formed by mixing ring shaped organo-siloxane with a compound as illustrated in FIG. 10. These technologies are disclosed for example in U.S. Published Patent Appln. No. 2010/0219512, the entirety of which is hereby expressly incorporated by reference.

Figure 11A:
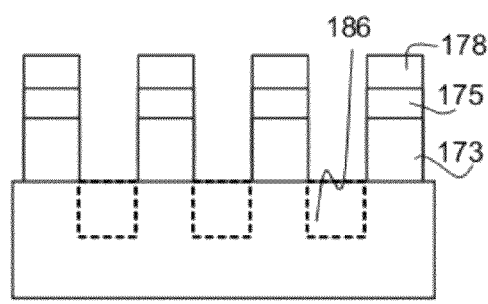
FIGS. 11A and 11B conceptually illustrate the improved dimensional tolerances that may be achieved by preferred embodiments of the present invention.
Figure 11A:
Figure 11A:
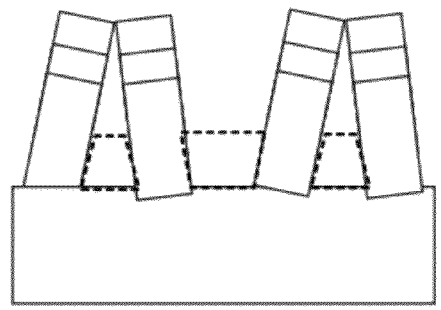
Figure 11B:
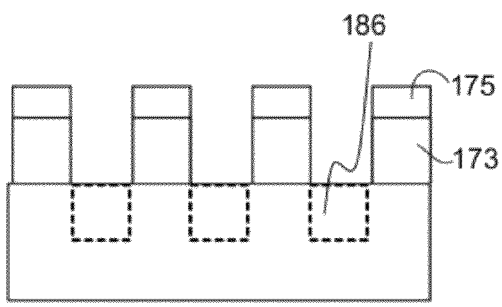
Figure 11B:
Figure 11B:
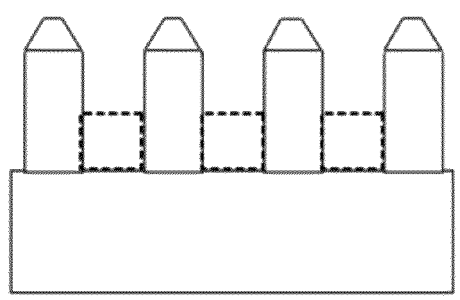
Figure 12A:
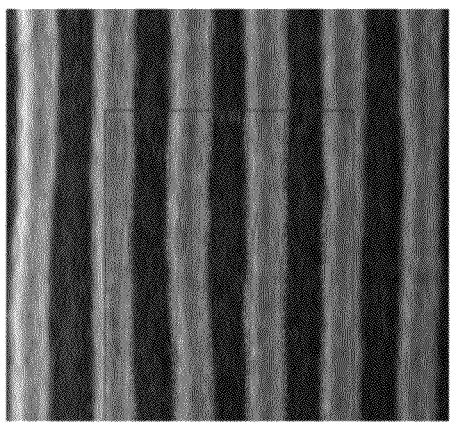
FIGS. 12A and 12B are pictures of experimental results corresponding to FIGS. 11A and 11B.

FIG. 11A shows schematically and for purposes of comparison the effect when trenches 186 are formed with the metal film 178 still in place, as is conventional. FIG. 11B shows by contrast when the metal film 178 is removed prior to forming trenches 186 in insulator film 173, as per various embodiments of the present invention. Low-k film such as porous SiOCH is usually used for the insulator layer 173. The stress difference between metal film 178 and the insulator layer 173 becomes more critical as the pattern size is reduced. This stress difference causes pattern "wigging" or "flop over", as shown in FIGS. 11A and 12A.

Figure 12B:
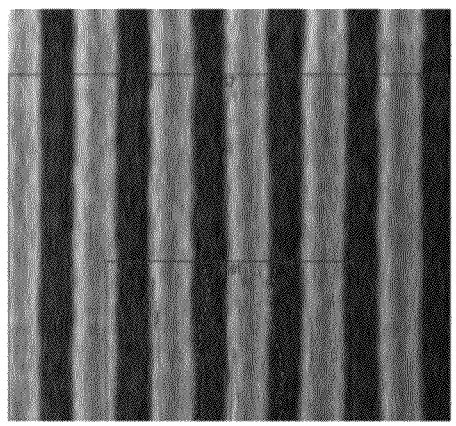

On the other hand, in the FIG. 11B, the metal mask 178 is removed before forming the trenches 186 in the insulator layer 173, using only dielectric layer 175 as a mask. In this case, the pattern "wiggling" or "flop over" does not occur, even if the pattern size is reduced. FIG. 12B shows an example of these results. Fine trench patterns are formed without "wiggling" or "flop over."

Additional advantages of these embodiments include that, as the metal mask 179 has not remained on the dielectric film mask 176 during etching the trenches 186, the aspect ratio of the interconnect 155 is reduced when filling the metal into the via and trench by plating or PVD. This enables filling the trenches and vias with less chance of voids.

Furthermore, as a top corner of the dielectric layer 175 is rounded during the etching of trenches 186, when forming the PVD barrier or seed films before copper plating, overhang at the top corner of the dielectric pattern is reduced. Conventional methods typically require a separate etching step to ensure this rounded shape at the top corner of the dielectric pattern, which damages the surface of the insulator layer 173. The embodiments described above provide the desired contour without an extra etching step and hence without the attendant damage to the insulator layer 173.

Figure 13:
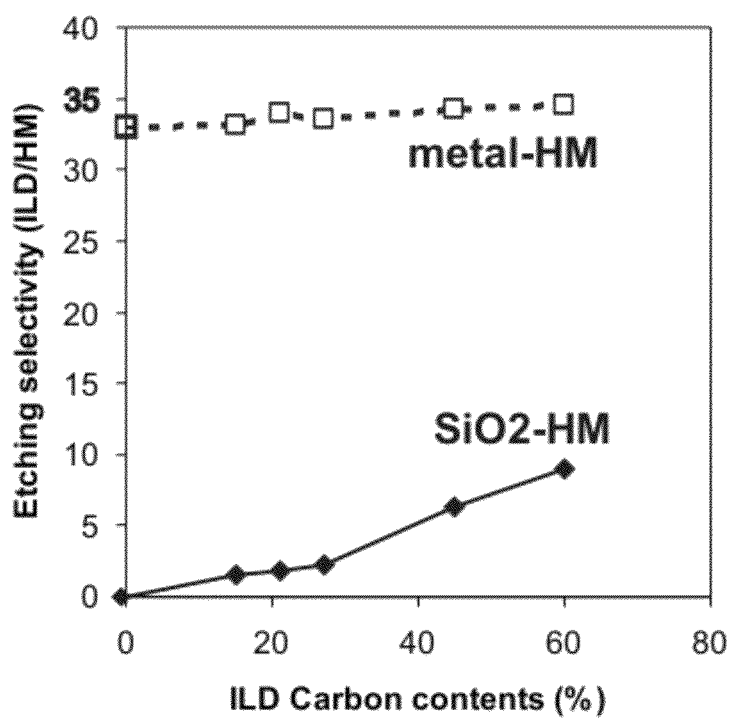
FIG. 13 illustrates measured etching selectivity of embodiments according to the invention in relation to a conventional technique.

FIG. 13 shows results of the measured etching selectivity between the insulator layer 173 and the dielectric layer 175 or the metal film 178 as a function of the carbon content of the insulator layer 173. In particular, the etching selectivity relationship between the insulator layer 173 and the metal film 178 is almost constant when changing the carbon contents in the insulator layer 173. On the other hand, the carbon content of the insulator layer 173 significantly affects the etching selectivity between a silicon dioxide-containing dielectric layer 175 and the insulator layer 173. To ensure an etching selectivity more than 5 between the insulator layer 173 and the dielectric layer 175, a porous SiOCH material which includes more than 40 atomic % carbon is preferred for use as the insulator layer 173.

The embodiments of the present invention were described above with reference to the drawings. However, these embodiments are illustrative of the present invention and it is possible to adopt various configurations other than those described above.

What is claimed is:

1. A method of making a semiconductor device comprising the steps of:

forming a first pattern in both a metal film and an underlying dielectric layer that overlie an insulator layer above a semiconductor substrate, the metal film and the underlying dielectric layer defining the same first pattern, the first pattern exposing a surface area of the insulator layer uncovered by the first pattern, and the metal film is formed over the dielectric layer;

forming a second pattern in the insulator layer, the second pattern being defined at least in part by a first mask positioned above the first pattern of the metal film and the dielectric layer, wherein the first mask covers a part of the surface area of the insulator layer uncovered by the first pattern, the second pattern having a first depth in the insulator layer;

after the second pattern forming step, removing the metal film while leaving the dielectric layer; and after removing the metal film while leaving the dielectric layer, using the dielectric layer as a second mask, etching the insulator layer such that a portion of the insulator layer uncovered by etching of the dielectric layer extends into the insulator layer to a second depth different than the first depth of the second pattern in the insulator layer.

2. The method according to claim 1, wherein the second pattern is defined by said first mask and said first pattern in said metal film.

3. The method according to claim 1, wherein the first mask comprises a patterned layer of photoresist.

4. The method according to claim 1, wherein the first pattern comprises a series of elongated openings arranged generally parallel to one another, corresponding to trenches to be formed in the insulator layer.

5. The method according to claim 1, wherein the second pattern comprises an array of openings corresponding to vias to be formed through the insulator layer.

6. The method according to claim 1, wherein the first pattern is transferred to the insulator layer as a series of trenches whose depth is less than the thickness of the insulator layer, and wherein the second pattern is formed in the insulator layer as an array of vias that pass entirely through the insulator layer.

7. The method according to claim 1, wherein a further interconnect layer is present between the substrate and the insulator layer.

8. The method according to claim 7, wherein the insulator layer is etched to expose the interconnect after forming the first pattern in the insulator layer.

9. The method according to claim 1, wherein the first pattern is a trench and the second pattern is a via.

10. The method according to claim 1, wherein an etching selectivity between the insulator layer and the dielectric layer is from 5 to 20.

11. The method according to claim 1, wherein the insulator layer has a carbon content of greater than 50%.

12. The method according to claim 1, wherein the dielectric layer is silicon oxide.

13. The method according to claim 1, wherein the metal film is selected from the group consisting of TiN, TaN and WN.

14. The method according to claim 1, wherein said forming, removing, and etching steps are performed in a common process chamber.

15. A method of making a semiconductor device comprising the steps of:

in an arrangement of a metal film formed over and in contact with a dielectric layer, the dielectric layer formed over and in contact with an insulator layer located above a semiconductor substrate, a forming a first pattern common to both the metal film and the dielectric layer, the first pattern exposing plural spaced-apart surface areas of the insulator layer uncovered by the first pattern;

forming a first mask over the first pattern of the metal film and the dielectric layer and a part of the exposed spaced-apart surface areas of the insulator layer;

etching through the first mask to form a second pattern of a first depth in the insulator layer, the second pattern being defined at least in part by the first mask, wherein the first mask covers a part of the surface area of the insulator layer uncovered by the first pattern and defines plural spaced-apart regions;

after the second pattern forming step, removing the metal film while leaving the dielectric layer; and after removing the metal film while leaving the dielectric layer, using the dielectric layer as a second mask, etching the insulator layer such that a portion of the insulator layer uncovered by etching of the dielectric layer extends into the insulator layer to a second depth less than the first depth of the second pattern in the insulator layer.

16. The method according to claim 15, wherein the second pattern defines plural spaced-apart vias within the insulator layer.

\* \* \* \* \*